US012649979B2

(12) United States Patent
Wang et al.

(10) Patent No.: US 12,649,979 B2
(45) Date of Patent: Jun. 9, 2026

(54) LARGE-SCALE COMPOUND SEMICONDUCTOR SINGLE CRYSTAL GROWTH SYSTEM AND METHOD

(71) Applicant: THE 13TH RESEARCH INSTITUTE OF CHINA ELECTRONICS TECHNOLOGY GROUP CORPORATION, Shijiazhuang (CN)

(72) Inventors: Shujie Wang, Shijiazhuang (CN); Niefeng Sun, Shijiazhuang (CN); Yanlei Shi, Shijiazhuang (CN); Huimin Shao, Shijiazhuang (CN); Senfeng Xu, Shijiazhuang (CN); Lijie Fu, Shijiazhuang (CN); Yang Wang, Shijiazhuang (CN); Xiaolan Li, Shijiazhuang (CN); Xin Ou, Shijiazhuang (CN); Ruiliang Song, Shijiazhuang (CN); Huisheng Liu, Shijiazhuang (CN); Tongnian Sun, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 373 days.

(21) Appl. No.: 18/291,881

(22) PCT Filed: Dec. 8, 2021

(86) PCT No.: PCT/CN2021/136318
§ 371 (c)(1),
(2) Date: Jan. 24, 2024

(87) PCT Pub. No.: WO2022/213643
PCT Pub. Date: Oct. 13, 2022

(65) Prior Publication Data
US 2024/0229291 A1     Jul. 11, 2024

(30) Foreign Application Priority Data

Apr. 8, 2021     (CN) .......................... 202110376836.1

(51) Int. Cl.
| | |
|---|---|
| *C30B 15/02* | (2006.01) |
| *C30B 15/00* | (2006.01) |
| *C30B 15/10* | (2006.01) |
| *C30B 15/22* | (2006.01) |
| *C30B 29/40* | (2006.01) |

(52) U.S. Cl.
CPC ............ *C30B 15/02* (2013.01); *C30B 15/002* (2013.01); *C30B 15/10* (2013.01); *C30B 15/22* (2013.01); *C30B 29/40* (2013.01)

(58) Field of Classification Search
CPC .................................................. Y10T 117/1056
See application file for complete search history.

(56) References Cited

U.S. PATENT DOCUMENTS

| | | | | | |
|---|---|---|---|---|---|
| 5,290,395 | A | * | 3/1994 | Matsumoto ............. | C30B 15/12 117/17 |
| 5,493,985 | A | * | 2/1996 | Bliss ....................... | C30B 15/02 117/77 |

(Continued)

FOREIGN PATENT DOCUMENTS

| | | |
|---|---|---|
| CN | 110923806 A | 3/2020 |
| CN | 112410883 A | 2/2021 |

(Continued)

OTHER PUBLICATIONS

International Preliminary Report on Patentability mailed Oct. 10, 2023 in PCT/CN2021/136318, filed Dec. 8, 2021.

(Continued)

*Primary Examiner* — Robert M Kunemund
(74) *Attorney, Agent, or Firm* — AP3 Law Firm PLLC

(57) ABSTRACT
A system and method for growing a large-size compound semiconductor single crystal belong to the field of single crystal preparation, in particular to a system and method for (Continued)

preparing a large-size, especially ultra-long compound semi-conductor single crystal. The large-size single crystal growth system includes a crystal growth space control device and a raw material injection device within a furnace body. The raw materials are injected in the raw material synthesis and crystal growth processes, and the growth space is adjusted according to the length of the single crystal.

9 Claims, 9 Drawing Sheets

(56) References Cited

U.S. PATENT DOCUMENTS

| 5,656,079 | A | * | 8/1997 | Bliss | C30B 15/02 |
| | | | | | 117/223 |
| 8,257,496 | B1 | * | 9/2012 | Bender | C30B 29/06 |
| | | | | | 117/214 |
| 2015/0259821 | A1 | * | 9/2015 | Kwon | C30B 15/12 |
| | | | | | 117/214 |

FOREIGN PATENT DOCUMENTS

| CN | 113174630 | A | 7/2021 |
| CN | 113249778 | A | 8/2021 |
| CN | 215050847 | U | 12/2021 |

OTHER PUBLICATIONS

International Search Report and Written Opinion mailed Mar. 1, 2022 in PCT/CN2021/136318, filed Dec. 8, 2021.
Zhou. Xiaolong et al., Growth of Large Diameter InP Single Crystal: Semiconductor Technology, vol. 34, No. 4, Apr. 3, 2009 (Apr. 3, 2009), pp. 311-314.

* cited by examiner

LARGE-SCALE COMPOUND SEMICONDUCTOR SINGLE CRYSTAL GROWTH SYSTEM AND METHOD

CROSS-REFERENCE

This application claims the priority of PCT Application Publication No. WO/2022/213643, filed on Dec. 8, 2021, which claims priority to Chinese Patent Application No. 202110376836.1, filed on Apr. 8, 2021, the entirety of which is hereby incorporated by reference.

FIELD OF THE INVENTION

The present invention belongs to the field of single crystal preparation, in particular to a system and method for preparing a large-size, especially ultra-long compound semiconductor single crystal.

BACKGROUND OF THE INVENTION

As a semiconductor material, the growth of single crystals requires a high-temperature and high-pressure environment. Currently, crystal growth is accomplished in an airtight fixed space.

Large-size and long single crystals enable the preparation of as many large-size semiconductor single crystal substrates as possible, which will significantly reduce the cost of subsequent devices. At present, almost all semiconductor single crystals are developed in the direction of large-size and long single crystals.

When it is necessary to grow and manufacture large-size crystals, especially when there is a requirement for the length, it is needed to increase the volume of the airtight space, especially in the longitudinal direction where the length of the space needs to be increased.

For compound semiconductors that need to be grown in a high-pressure environment, it is very difficult to perform high-volume synthesis and grow large-size and long single crystals with high quality because the uneven distribution of the temperature field in the airtight space and the increase of the space result in large convections in the thermal field. Moreover, as the crystal length increases, dislocation extends and proliferates severely.

For example, when growing InP, due to the high dissociation pressure of phosphorus, the convection in the thermal field is large, and it is very difficult to carry out high-volume synthesis and grow large-size and long single crystals with high quality. No solutions are available at present.

In addition, when growing and manufacturing large-size crystals, the raw materials required increase accordingly. One means of increasing the raw materials is to increase the volume of the crucible, causing the problem that the temperature field in the crucible is difficult to control.

Two solutions exist at present for this problem: supplying materials with a plurality of crucibles, and adding a material supply device outside the furnace body.

Chinese patent 200310108634.0 discloses a device and method for growing crystals by melt replenishment, using a plurality of communicated crucibles to increase the supply of the raw materials, which will greatly increase the volume of the furnace body.

Chinese Patent 201621248917.4 discloses a crystal growth furnace capable of achieving continuous production, wherein a plurality of crucible assemblies are sequentially moved into the furnace body via a horizontal moving mechanism and a vertical lifting mechanism, which potentially interrupts the growth process of the crystals and affects the quality of the crystals.

Chinese Patent 201720922581.3 adopts another technical route and discloses a material supply apparatus and a crystal growth system, the disclosed material supply apparatus supplying materials from the outside to the crucible inside the furnace body. As two types of apparatuses are connected, the complexity of apparatus control is increased; and supplying materials from the outside of the furnace body may cause contamination of the materials in the material supply process.

SUMMARY OF THE INVENTION

The present invention is proposed aiming at the above problems.

In order to achieve the inventive objective, the technical solution adopted in the present invention is as follows: a large-size single crystal growth system, comprising a crucible, two or more main body columns, and a main furnace body disposed between the main body columns and located on a support table.

The system further comprises a crystal growth space control device and a raw material injection device within the furnace body, the raw material injection device comprising a plurality of raw material loading and injection systems independent to each other.

The crystal growth space control device comprises 1-4 movable furnace bodies disposed on the inner side or outer side of the main furnace body, the movable furnace bodies being disposed on the main body columns by means of drive motors and drive arms; and the top of the innermost or outermost movable furnace body is sealed, the other movable furnaces are open cylinders, and a seed crystal rod and a seed crystal rod driving device are disposed on the movable furnace with the top sealed.

The raw material injection device is disposed on a partition, and comprises an annular raw material water cooling disc and raw material loading and injection systems.

The raw material water cooling disc is uniformly provided with raw material slots; and the raw material loading and injection system comprises a raw material loader, a resistance wire disposed around the raw material loader, a raw material injection tube in communication with the raw material loader, and a raw material loader top cover.

The raw material loading and injection system is inserted into the raw material slot, and the raw material injection tube protrudes from an injection tube groove. 6 to 12 raw material slots are provided; and 2 lengths are set for the raw material injection tube, the outlet of which is higher than or lower than the liquid level of the melt in the crystal growth process, respectively.

Based on the above system, the present invention also proposes a preparation method of a large-size single crystal.

The preparation method comprises the following steps:

Step A, placing raw materials required for crystal growth in the crucible and the raw material loading and injection systems, so as to assemble a large-size single crystal growth system.

Step B, heating the crucible to form a melt in the crucible.

Step D, starting crystal growth.

Step E, determining the residual amount of the raw material in the crucible, starting necking if the residual amount is less than 15-20% of the total amount of the raw material at the time of starting crystal growth, performing step F after the necking is completed, otherwise continuing the crystal growth.

Step F, initiating two or more raw material loading and injection systems to inject the raw materials into the crucible.

Step G, starting crystal growth while adjusting the crystal growth space using the crystal growth space control device according to the crystal length.

Steps E-G are repeated until the injection of all raw materials is completed.

Further, the position range of the liquid level of the melt in the crucible is determined according to the optimal seeding position range, the total amount of the melt below this position is determined according to an intermediate value in the position range of the liquid level of the melt and the shape of the crucible, and the amount of the raw materials in one pair of raw material loading and injection systems is 1/n the total amount of the melt, n being a positive integer and n<5.

Further, the crystal growth space control device comprises 1-4 movable furnace bodies disposed on the inner side or outer side of the main furnace body, the movable furnace bodies being disposed on the main body columns by means of drive motors and drive arms; and the top of the innermost or outermost movable furnace body is sealed, the other movable furnace bodies are open cylinders, and the seed crystal rod and the seed crystal rod driving device are disposed on the movable furnace body with the top sealed.

Further, the raw material injection device comprises an annular raw material water cooling disc and raw material loading and injection systems.

The raw material loading and injection system is inserted into the raw material slots, and the raw material injection tube protrudes from an injection tube groove.

The present invention designs a preparation method of a large-size single crystal. At first, a scalable single crystal growth system suitable for large-size crystal growth is proposed, which is provided with a multi-stage furnace body structure, a raw material water cooling disc is disposed in a single crystal furnace to cool down the high-purity raw materials (such as phosphorus and indium), and a plurality of independent raw material loading and injection systems are disposed in the raw material water cooling disc.

In the crystal growth process, the raw material loading and injection systems are controlled to be initiated sequentially, and the injection is stopped until the desired amount of melt is obtained; when the melt is close to being exhausted, the crystal starts to be necked to a size close to that of a seed crystal, then the next set of injection systems is initiated for synthesis until the desired amount of melt is obtained, and thereafter the crystal continues to grow up. The process is circulated in such a way for multiple turns of synthesis, single crystal growth, single crystal necking, re-synthesis, single crystal regrowth and alternating continuous preparation of single crystal growth, while the furnace body continues to elongate in the single crystal growth process to ensure that the crystal grows up to a sufficient length.

Beneficial effects: in the early stage of crystal growth, the growth space is small, convection in the thermal field is small, it is easy to carry out the seeding and diameter enlarging processes for crystal growth; after the crystal grows up, the furnace body starts to elongate as the crystal grows up, the cooling of the crystal itself will improve the stability of the crystal growth, and at the same time, due to the existence of multiple times of necking treatment, it can reduce the thermal stress of the crystal itself, to prevent breakage as the crystal grows too long, while substantially reducing the generation of defects and the extension of the original defects during the multiple growth processes; and such structure can be free from the limitation of the size of high-pressure preparation apparatuses.

The raw material loading and injection system can realize cooling of the loading and injection system to prevent the raw materials from being melted to flow out of or from being heated to sublimate. A plurality of loading and injection systems can be placed in the device to enable continuous synthesis or intermittent synthesis. Crystal growth can be achieved by continuous synthesis in a smaller crucible, then synthesis is stopped until the desired amount of melt is synthesized, then re-synthesis and crystal regrowth are performed, and the process is alternated in such a way, thereby achieving the preparation of long single crystals, while saving energy and related consumptive materials.

The amount of the raw materials in one pair of raw material loading and injection systems is determined according to the optimal seeding position to ensure that the liquid level in the crucible is at the optimal seeding position during seeding.

In addition, placing an elementary substance in the raw material loading and injection system can allow the growth of elemental semiconductors such as monocrystalline silicon and germanium; placing two substances can allow the growth of crystals such as indium phosphide (InP) and gallium phosphide (GaP); and three raw materials can be placed for the growth of ternary or more compound semiconductor crystals such as zinc germanium phosphide (ZnGeP2), realizing flexible operation and high adaptability.

In which, 1: main furnace body; 2: primary furnace body; 3: secondary furnace body; 4: tertiary furnace body; 5: support table; 6: seed crystal rod; 7: seed crystal rod lifting motor; 8: seed crystal rod rotating motor; 9: crucible rod; 10: crucible rod lifting motor; 11: crucible rod rotating motor; 12: vacuum pipeline; 13: gas filling/venting pipeline; 14: relief valve; 15: main body column; 16: primary drive motor; 16-1: primary drive arm; 17: secondary drive motor; 17-1: secondary drive arm; 18: tertiary drive motor; 18-1: tertiary drive arm; 19: main furnace body drive motor; 19-1: main drive arm; 20: chassis; 20-1: column motor; 21: insulation sleeve; 22: main heater; 23: auxiliary heater; 24: crucible; 25: crucible support; 30: seed crystal; 31: single crystal ingot; 33: seal groove; 34: seal ring; 26-1: raw material; 26-2: solid boron oxide; 1-1: partition; 27: raw material water cooling disc; 27-1: raw material slot; 27-2: injection tube groove; 27-3: raw material water cooling disc cover; 28: raw material loading and injection system; 28-2:

raw material loader; 28-3: raw material; 28-4: resistance wire; 28-5: raw material injection tube; 28-6: raw material loader top cover; 28-7: insulation layer top cover; 28-8: wire hole; 28-9: insulation layer outer cylinder; 28-10: injection tube placement slot; 28-11: insulation layer baffle; and 32: waterway connection pad.

DETAILED DESCRIPTION OF THE EMBODIMENTS

Figure 1:
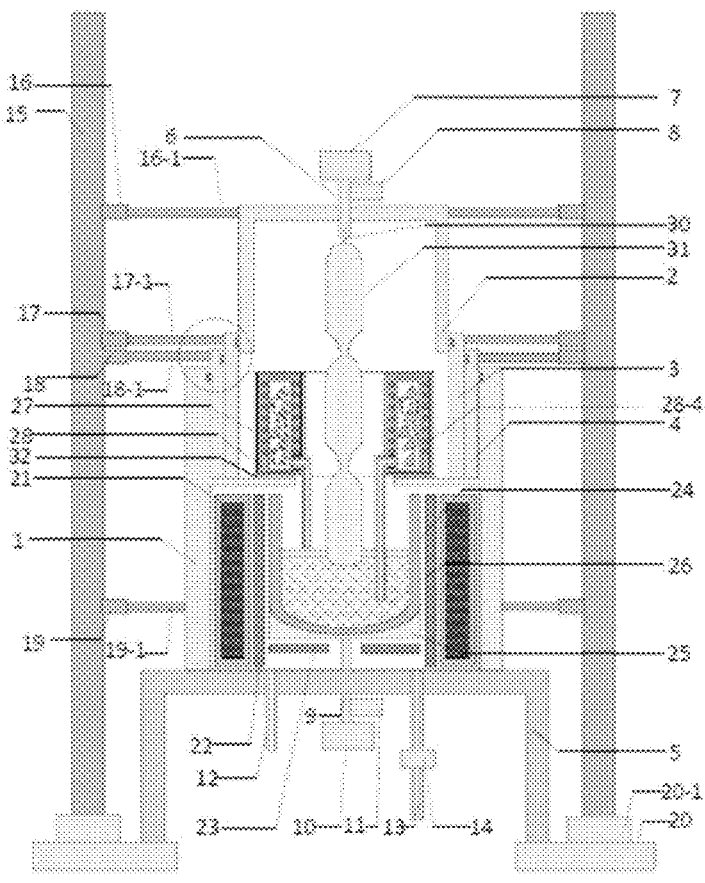
FIG. 1 is a structure diagram of the present invention.

Refer to FIG. 1, a large-size single crystal growth system includes two or more main body columns 15, which are disposed on chassis 20 by column motors 20-1; the main furnace body 1 is disposed between the main body columns 15 and located on a support table 5, the main furnace body 1 has a crucible 24 and crucible heating and supporting structures therein, and a seed crystal rod 6 and a seed crystal rod driving device are above the crucible 24; the main furnace body 1 is an open cylinder, which is positioned on the main body columns 15 through main furnace body drive motors 19 and main drive arms 19-1; and a partition 1-1 is disposed in the middle of the inside of the main furnace body 1, and the main furnace body 1 is divided into two parts by the partition 1-1. The system further includes a crystal growth space control device cooperating with the main furnace body 1 and a raw material injection device disposed on the partition 1-1.

The crucible heating structure includes an insulation sleeve 21, a main heater 22, and an auxiliary heater 23. The crucible supporting structure includes a crucible rod 9 passing through the support table 5, and a crucible rod lifting motor 10 and a crucible rod rotating motor II connected to the crucible rod 9.

The system further includes a vacuum pipeline 12 and a gas filling/venting pipeline 13 which pass through the support table 5 to reach the main furnace body 1, the gas filling/venting pipeline 13 being connected to a relief valve 14.

The main body column 15 moves around the chassis 20 via the column motor 20-1.

Crystal Growth Space Control Device.

The space control device can be implemented in various ways, such as the main furnace body in a segmented design, with each segment being retractable. However, such structure is complex in apparatus and not easy to realize. It is also possible to provide a seal cover movable up and down in the main furnace body 1, but the sealing with the inner wall of the main furnace body 1 is not easy to realize.

The crystal growth space control device of the present invention is 1 to 4 movable furnace bodies disposed on the inner side or outer side of the main furnace body 1. The movable furnace bodies are disposed on the main body columns 15 by means of drive motors and drive arms.

When the movable furnace bodies are disposed on the outer side of the main furnace body 1, the top of the outermost movable furnace body is sealed, and the drive arm of the movable furnace body is disposed at the bottom of the outer side of the movable furnace body; and when the movable furnace bodies are disposed on the inner side of the main furnace body 1, the top of the innermost movable furnace body is sealed, and the drive arm of the movable furnace body is disposed at the top of the outer side of the movable furnace body.

In this example, the top of only one of the removable furnace bodies is sealed, the other removable furnace bodies are open cylinders, and the seed crystal rod 6 and the seed crystal rod driving device are disposed on the removable furnace body with the top sealed.

In this example, three movable furnace bodies are disposed on the inner side of the main furnace body 1, which are a primary furnace body 2, a secondary furnace body 3 and a tertiary furnace body 4 from inside to outside, respectively, and the three movable furnace bodies are connected to the main body columns 15 via primary drive motors 16 and primary drive arms 16-1, secondary drive motors 17, and secondary drive arms 17-1, and the tertiary drive motors 18 and tertiary drive arms 18-1, respectively.

The top of the primary furnace body 2 is sealed, and the seed crystal rod 6 and the seed crystal rod driving device are disposed on the primary furnace body 2.

A main furnace body drive motor 19 is limited in a vertical track or spiral track (not shown in the figure) of the main body column 15, one end of a main drive arm 19-1 is connected to the main furnace body drive motor 19, and the other end thereof is connected to the main furnace body 1. The main furnace body drive motor 19 is disposed on each of the main body columns 15, and at least two sets of the main furnace body drive motors 19 and the main drive arms 19-1 are provided, depending on the number of the main body columns 15. When initially installed, it is to be ensured that respective main furnace body drive motors 19 are in the same horizontal position, and when in operation, respective main furnace body drive motors 19 run synchronously to ensure the horizontal position of the main furnace body 1. The main furnace body 1 and these furnace bodies move up and down along the main body columns 15 through the matching drive motors and drive arms.

The drive motors and drive arms of the 3 movable furnace bodies are disposed in the same way as described above.

The inner and outer diameters of the neighboring removable furnace bodies are matched, and the gaps between the main furnace body 1 and the tertiary furnace body 4, between the tertiary furnace body 4 and the secondary furnace body 3, and between the secondary furnace body 3 and the primary furnace body 2 are from 0.1 to 0.5 mm.

In order to increase airtightness, seal grooves 33 are also formed inside the primary furnace body 1 and the removable furnace bodies, each seal groove 33 provided with a seal ring 34 therein.

Figure 8:
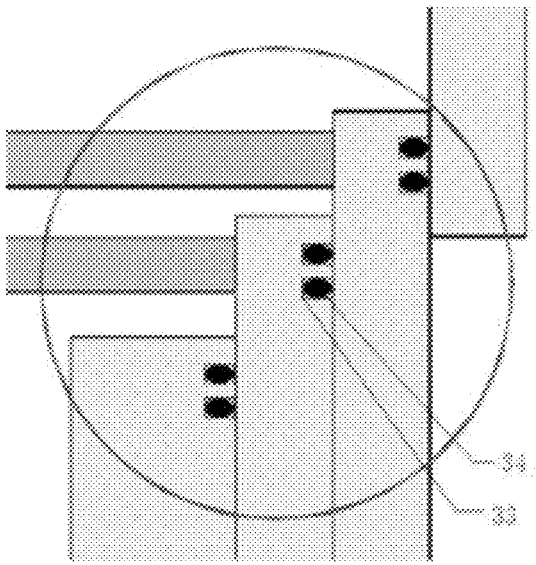
FIG. 8 is a partially enlarged view of FIG. 1.

Refer to FIG. 8, in this example, the seal ring 34 is located in the seal groove 33 in the inner wall of the main furnace body 1 and the inner wall of each of the removable furnaces, and two seal rings 34 are used for sealing between furnace bodies, with the two seal grooves 33 at a distance of 15-30 mm. The position of the upper seal groove 33 is 15 mm-30 mm from the top of the furnace body, and the extreme position of movement of the removable furnace body is the vertical distance (15 mm-30 mm) from the bottom end of this removable furnace body to the lower seal groove 33 of the neighboring furnace body.

In this example, the main furnace body 1 is in close contact with the support table 5, and seal gaskets can be added if necessary; the top of the innermost primary furnace body 2 is sealed; and the neighboring furnace bodies are matched with each other in size and are sealed with the seal rings 34, thus forming an airtight space required for crystal growth.

Raw Material Injection Device.

The raw material injection device is disposed above the crucible 24 in the main furnace body 1. The device includes an annular raw material water cooling disc 27 and raw material loading and injection systems 28, as shown in FIG. 1.

The interior of the main furnace body 1 is provided with a circulating waterway. The raw material water cooling disc 27 is made of copper, the interior thereof is provided with a circulating waterway, and an outlet and an inlet for circulating water are provided, which are in communication with the circulating waterway inside the main furnace body 1. This is an ordinary water cooling structure.

The partition 1-1 is a part of the main furnace body 1 and can withstand high temperatures because the interior of the partition is provided with a circulating waterway connected to the main furnace body 1. The circulating waterway in the partition 1-1 is delivered to the circulating waterway of the raw material water cooling disc 27 via a waterway connection pad 32, and in the middle of the waterway connection pad 32 are two pipelines connecting the partition 1-1 with the circulating water inlet and outlet of the raw material water cooling disc 27.

The above is a common design structure and is not labeled in the figures.

Figure 11:
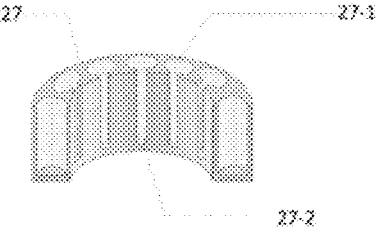
FIG. 11 is a sectional view of a raw material water cooling disc.
Figure 12:
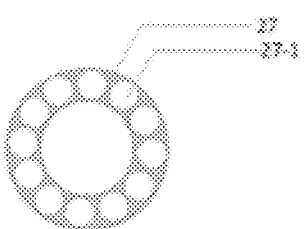
FIG. 12 is a top view of the raw material water cooling disc.
Figure 13:
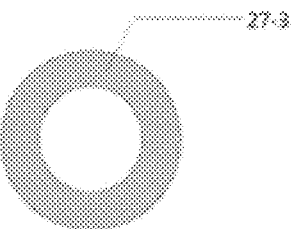
FIG. 13 is a cover of the raw material water cooling disc.

Refer to FIG. 11 to FIG. 13, the raw material water cooling disc 27 is annular, has an outer diameter smaller than the inner diameter of the main furnace body 1, has an inner diameter smaller than or equal to the inner diameter of the crucible 24, and is provided with 6 to 12 raw material slots 27-1 uniformly arranged; on the inner side of the raw material water-cooling disc 27, each raw material slot 27-1 is provided with an injection tube groove 27-2 in a matching way; and the raw material water cooling disc 27 is also provided with a matching raw material water cooling disc cover 27-3.

The interior of the raw material slot 27-1 is barrel-shaped, and may be a through hole penetrating through the raw material water cooling disc 27 or a hole not penetrating through the raw material water cooling disc 27. In order to reduce the affects of the thermal field of the crucible below, in this example, the raw material slot 27-1 is not a through hole.

The thickness of the water-cooled copper wall inside the raw material water cooling disc 27 is 10-15 mm.

The injection tube groove 27-2 starts from the top of the raw material slot 27-1 and has a length greater than ⅘ the height of the raw material water cooling disc 27.

Figure 9:
FIG. 9 is a structure diagram of a raw material loading and injection system.

Refer to FIGS. 1 and 9, the raw material loading and injection system 28 includes a raw material loader 28-2, a resistance wire 28-4 disposed around the raw material loader 28-2, a raw material injection tube 28-5 in communication with the raw material loader 28-2, and a raw material loader top cover 28-6.

Figure 10:
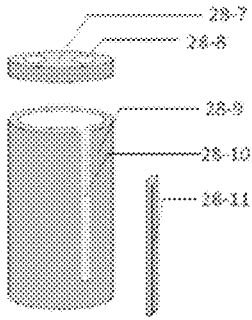
FIG. 10 is a structure diagram of a raw material loader sleeve.

Refer to FIG. 10, the raw material loading and injection system 28 further includes a raw material loader 28-2 sleeve. The main body of the sleeve is an insulation layer outer cylinder 28-9, the top of the insulation layer outer cylinder 28-9 is open, and a matching insulation layer top cover 28-7 with wire holes 28-8 is provided. The insulation layer outer cylinder 28-9 is provided with an injection tube placement slot 28-10 and a matching insulation layer baffle 28-11 on the side face. The raw material loader 28-2 is placed in the insulation layer outer cylinder 28-9, and the raw material injection tube 28-5 protrudes from the injection tube placement slot 28-10.

The raw material injection tube 28-5 is disposed at the bottom of the raw material loader 28-2 to facilitate the injection of a liquid raw material.

Two lengths are set for the raw material injection tube 28-5, the outlet of which is higher than or lower than the liquid level of the reactive melt during the crystal growth process, respectively, to satisfy the injection needs of liquid and gaseous raw materials.

Two lengths are set for the raw material injection tube 28-5, the outlet of which is higher than or lower than the liquid level of the upper surface of a liquid sealant above the melt at the optimal seeding position, respectively. A metallic or non-sublimable element is placed in the loader 28-2 with the outlet higher than the liquid level of the upper surface of the boron oxide above the melt at the optimal seeding position, and a sublimable element is placed in the loader 28-2 with the outlet lower than the liquid level of the upper surface of the boron oxide above the melt at the optimal seeding position.

The raw material water cooling disc 27 is 40-60 mm higher than the raw material loader 28-2, the interior of the raw material slot 27-1 is a cylinder, and the distance between the circle centers of neighboring raw material slots 27-1 is greater than D+40 mm, D being the diameter of the raw material slot 27-1.

The raw material loading and injection systems 28 are inserted into the raw material slots 27-1 and the raw material water cooling disc cover 27-3 covers the raw material water cooling disc 27. The raw material injection tubes 28-5 protrude from the injection tube grooves 27-2 and are aligned with the crucible 24 below. Since the inner diameter of the raw material water cooling disc 27 is less than or equal to the inner diameter of the crucible 24, it can be ensured that the raw material injection tubes 28-5 are aligned with the crucible 24, without leakage of raw materials.

When the raw material injection device is assembled, the raw material 28-3 for crystal growth is placed into the raw material loader 28-2, and then the raw material loader top cover 28-6 is welded to the raw material loader 28-2. Both the raw material loader top cover 28-6 and the raw material loader 28-2 are made of quartz.

The resistance wire 28-4 is wrapped around the outer side of the raw material loader 28-2, and they are jointly placed in the insulation layer outer cylinder 28-9. The raw material injection tube 28-5 is assembled in the injection tube placement slot 28-10, then the insulation layer baffle 28-11 is inserted into the injection tube placement slot 28-10 and they are assembled together.

The wires on two poles of the resistance wire 28-4 pass through the two wire holes 28-8 (not shown in the figure) in the insulation layer top cover 28-7.

Assembly of the Growth System.

Figure 2:
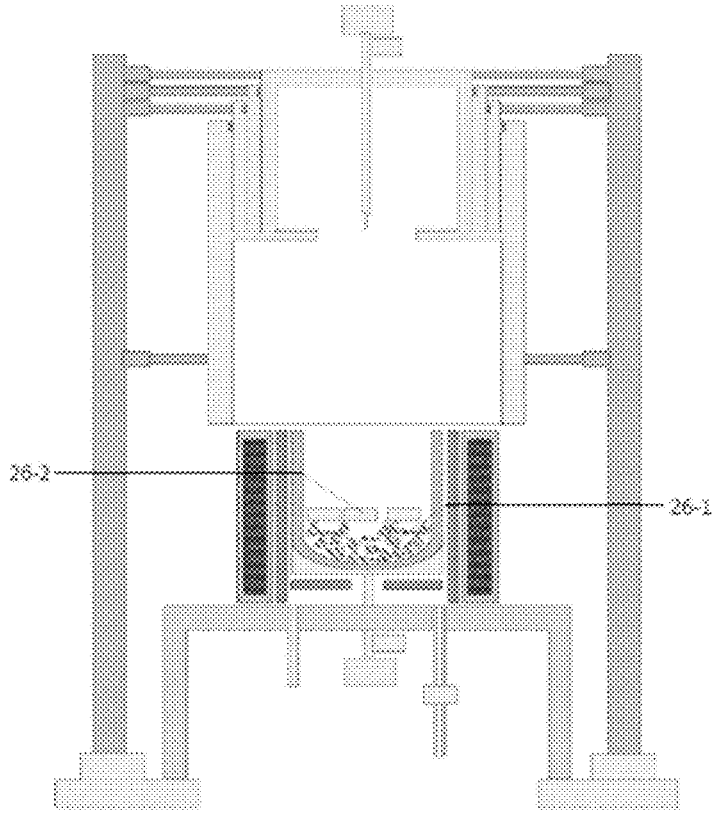
FIGS. 2 to 4 are assembly diagrams of an apparatus of the present invention.

Refer to FIG. 2.

I: the primary furnace body 2, the secondary furnace body 3, and the tertiary furnace body 4 are lowered onto the partition 1-1, and then the primary furnace body 2, the secondary furnace body 3, and the tertiary furnace body 4 are raised together with the main furnace body 1 to the highest position of the main body columns 15.

II: the insulation sleeve 21, the main heater 22, and the auxiliary heater 23 are assembled to the support table 5; and the crucible support 25 is connected to the crucible rod 9, and the crucible 24 is placed in the crucible support 25. The raw material 26-1 and solid boron oxide 26-2 are placed in the crucible 24.

The seed crystal 30 is assembled to the seed crystal rod 6.

Figure 3:
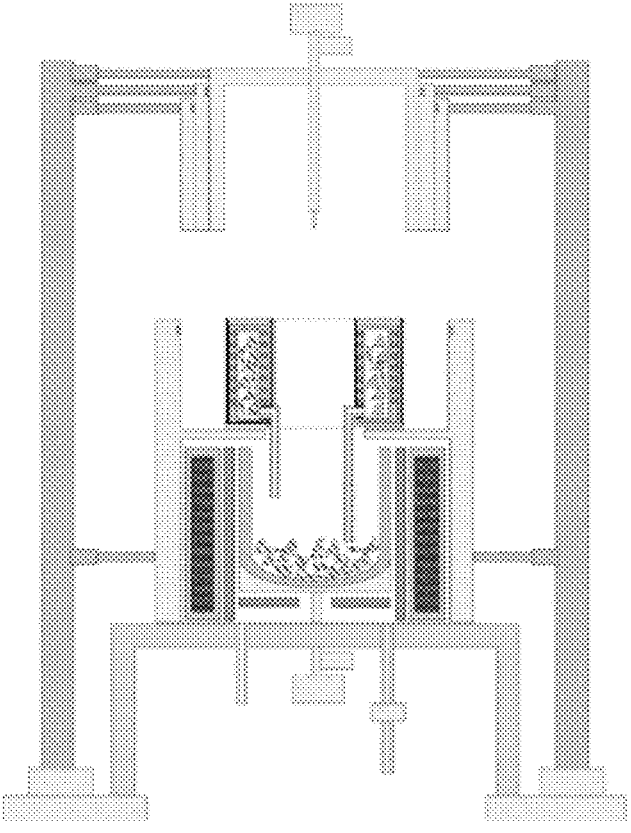

Refer to FIG. 3.

III: the main furnace body 1 is lowered onto the support table 5, at which point the primary furnace body 2, the secondary furnace body 3, and the tertiary furnace body 4 are separated from the main furnace body 1, and then the raw material water cooling disc 27 is connected to the partition 1-1 via the waterway connection pad 32, followed by placing the raw material loading and injection systems 28.

Figure 4:
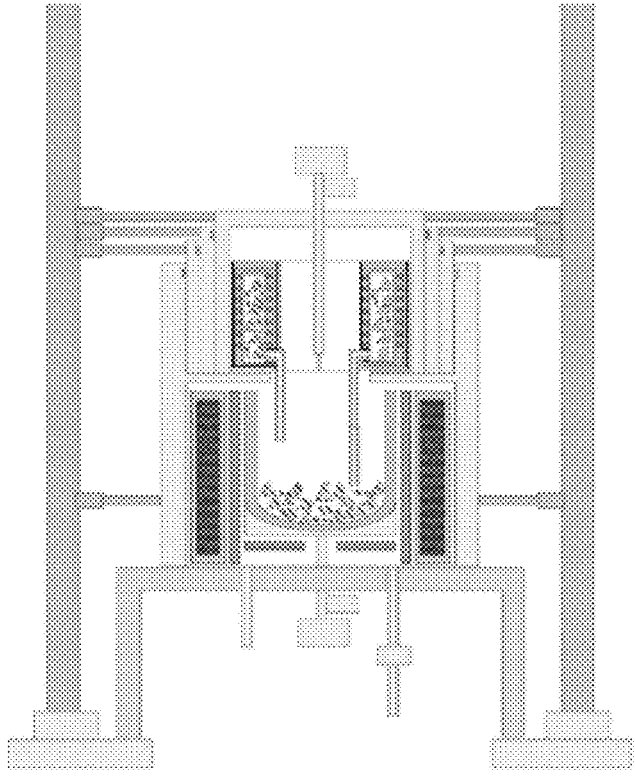

Refer to FIG. 4.

IV: the primary furnace body 2, the secondary furnace body 3, and the tertiary furnace body 4 are lowered onto the partition 1-1 to seal the furnace body.

The furnace body is evacuated to 10 Pa to $10^{-5}$ pa via the vacuum pipeline 12. Then an inert gas is filled through the gas filling/venting pipeline 13 to 4.0 Mpa.

After completion of the growth of a single crystal ingot 31, the gas in the furnace body is vented through the gas filling/venting pipeline 13. The primary furnace body 2 is raised again until it is separated from the secondary furnace body 3, while the secondary furnace body 3 and the tertiary furnace body 4 are sequentially lowered onto the partition 1-1, and the single crystal ingot 31 is removed.

Alternating Continuous Growth and Synthesis

Figure 5:
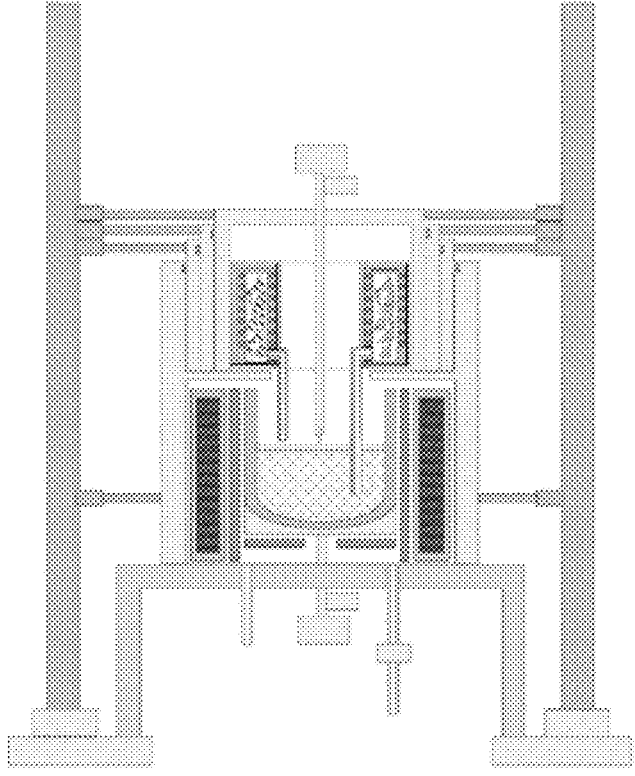
FIGS. 5 to 7 are schematic views of a crystal growth process.
Figure 6:
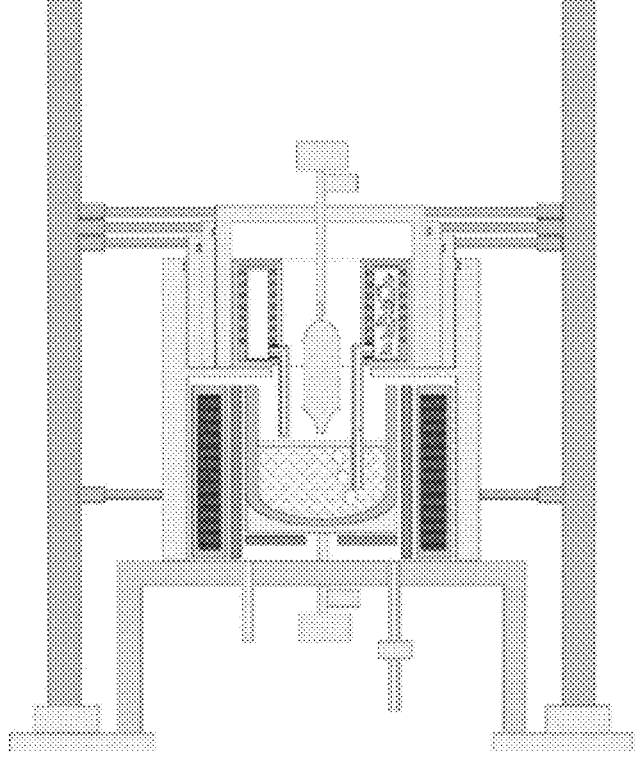
Figure 7:
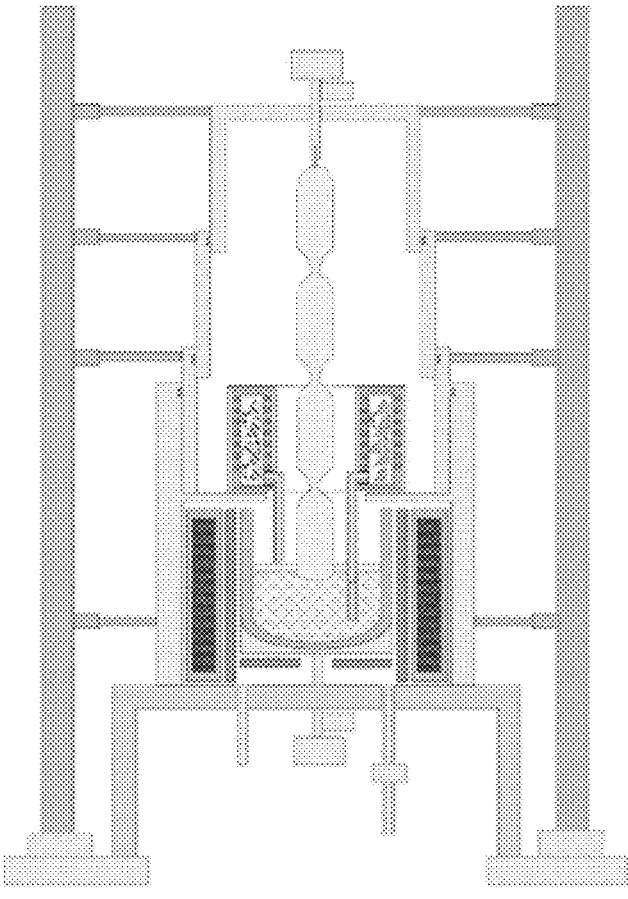

For ease of description, the raw material loading and injection systems 28 are hereinafter divided into a phosphorus injection system and an indium injection system according to different loaded raw materials. Refer to FIG. 5-7.

In Example 1, indium phosphide (InP) is grown

In this example, the raw material 26-1 is indium.

Step A, metal indium is placed in the crucible 24, and metal indium and phosphorus are placed in the raw material loading and injection systems, respectively, to assemble a large-size single crystal growth system.

Step B, the crucible is heated to form an indium melt within the crucible.

Step C, the raw material loading and injection system in which phosphorus is placed is initiated to inject gaseous phosphorus into the crucible to form an indium phosphide melt.

Step D, crystal growth starts.

Step E, the residual amount of indium phosphide in the crucible is determined, if the residual amount is less than 15-20% of the total amount of indium phosphide at the time of starting crystal growth, necking starts, and step F is performed after completion of the necking, otherwise crystal growth is continued.

Step F, two or more raw material loading and injection systems are initiated to inject liquid indium and gaseous phosphorus into the crucible, respectively, to form an indium phosphide melt.

It is specifically described as follows:

the raw material 26-1 metal indium is placed in the crucible, the injected raw materials are phosphorus and indium, separately placed in raw material loaders 28-2, and the raw material loading and injection systems 28 in which the two materials are placed are inserted into the raw material slots 27-1 in a spaced manner.

The amount of the raw material 26-1 metal indium in the crucible is the same as the amount of metal indium in a single indium injection system.

In the raw material loaders 28-2, the ratio of indium to phosphorus is 1:1.1-1.3. Considering that the gasified phosphorus may not react sufficiently in the melt and cause losses by bubbling out of the melt in the form of bubbles, the amount of phosphorus is appropriately increased during raw material proportioning in order to ensure the chemical ratio.

The port of the raw material injection tube 28-5 of the raw material loading and injection system 28 loading phosphorus is located at a distance of 1-5 mm from the bottom of the crucible, and should be immersed into the melt in the crystal growth process.

The port of the raw material injection tube 28-5 of the raw material loading and injection system 28 loading indium is 10 cm or more higher than the liquid level of the melted boron oxide 26-2.

I: the raw material 26-1 metal indium and the solid boron oxide 26-2 in the crucible 24 are heated to a temperature above the melting point of indium phosphide by means of the main heater 22 and the auxiliary heater 23 to form an indium melt.

The crucible rod 9 is initiated to rotate the crucible 24.

One of the phosphorus injection systems is heated to inject gasified phosphorus into the indium melt to form an indium phosphide melt approximate to the ratio. The above process is referred to as a primary synthesis cycle.

II: the seed crystal rod 6 is lowered so that the seed crystal 30 comes into contact with the indium phosphide melt to start crystal growth. The single crystal ingot 31 is grown by pulling the seed crystal 30 through the seed crystal rod 6.

When 15-20% of the melt remains in the crucible, necking of the single crystal ingot 31 starts; when 0.5-3% of the melt remains in the crucible, the single crystal ingot 31 is lifted up by the seed crystal rod 6, so that the necking interface rises to be near the optimal seeding position range. The above process is referred to as a primary growth cycle.

III: one of the indium injection systems is heated to inject indium in the form of a melt into the crucible, and the heating is stopped until all of the indium has been injected.

The other phosphorus injection system is heated to inject phosphorus into the crucible in the form of gas, and the heating is stopped until no more bubbles appear.

As a result of the proportional placement and injection of the raw material, a melt approximate to the chemical ratio is synthesized at this point. The above process is referred to as a secondary synthesis cycle.

IV: after the seed crystal rod 6 is adjusted so that the necking position of the single crystal ingot 31 comes into good contact with the melt, the temperature in the crucible 24 is controlled by the primary heater 22 and the auxiliary heater 23, and the growth of the single crystal ingot 31 is continued by starting seeding, diameter enlarging, and diameter equalizing, which start from the necking of the previous cycle, see FIG. 6.

When 15-20% of the melt remains in the crucible, necking of the single crystal ingot 31 starts; when 0.5-3% of the melt remains in the crucible, the single crystal ingot 31 is lifted up by the seed crystal rod 6, so that the necking interface rises to be near the optimal seeding position range.

The above work is repeated for synthesis and growth of the single crystal ingot 31. The above process is referred to as a secondary growth cycle.

V: in the above growth process, when the length of the crystal is close to the top of the primary furnace body 2 and the length of the seed crystal rod 6 is increased to the limit thereof, the primary furnace body 2 is driven by the primary drive motor 16 and the primary drive arm 16-1 to move upwards, and the inert gas is continuously filled in the furnace body through the gas filling/venting pipeline 13 to keep the pressure constant in the continuous rising process of the primary furnace body 2.

The primary furnace body 2 moves upwards to the limit position thereof, i.e. the vertical distance from the bottom end of the primary furnace body 2 to the seal groove 33 below the secondary furnace body 3 is 15 mm to 30 mm.

During the crystal growth process, the secondary furnace body 3 and the tertiary furnace body 4 are initiated in sequence in a similar way until the growth of the single crystal ingot 31 is completed.

After rising to the limit position, the primary furnace body 2 rises synchronously with the secondary furnace body 3, and after the secondary furnace body 3 rises to the limit position, the three furnace bodies rise synchronously.

Example 2, Indium Phosphide (InP) is Grown

In this example, the raw material 26-1 is an indium phosphide polycrystal.

Step A, an indium phosphide polycrystal is placed in the crucible 24, and metal indium and phosphorus are placed in the raw material loading and injection systems, respectively, to assemble a large-size single crystal growth system.

Step B, the crucible is heated to form an indium phosphide melt within the crucible.

Step D, crystal growth is started.

Step E, the residual amount of indium phosphide in the crucible is determined, if the residual amount is less than 15-20% of the total amount of indium phosphide at the time of starting crystal growth, necking starts, and step F is performed after completion of the necking, otherwise crystal growth is continued.

Step F, two or more raw material loading and injection systems are initiated to inject liquid indium and gaseous phosphorus into the crucible, respectively, to form an indium phosphide melt.

Step G, crystal growth starts while the crystal growth space is adjusted according to the crystal length.

Steps E-G are repeated until the injection of all raw materials is completed.

It is specifically described as follows:

the raw material 26-1 indium phosphide polycrystal is placed in the crucible, the injected raw materials are phosphorus and indium, separately placed in one raw material loaders 28-2, and the raw material loading and injection systems 28 in which the two materials are placed are inserted into the raw material slots 27-1 in a spaced manner.

In the raw material loaders 28-2, the ratio of indium to phosphorus is 1:1.1-1.3.

The amount of the raw material 26-1 indium phosphide polycrystal in the crucible 24 is determined as follows: after indium phosphide is formed into the melt, the liquid level in the crucible is within the range of the optimal seeding position.

The mass of the raw material 26-1 indium phosphide polycrystal in the crucible 24 is equal to the total mass of indium and phosphorus placed in one phosphorus injection system and one indium injection system, or the foregoing total mass is 1/n that of the raw material 26-1 indium phosphide polycrystal in the crucible 24, n<5.

The position of the raw material injection tube 28-5 of the raw material loading and injection system 28 is set as above.

I: the raw material 26-1 indium phosphide and the solid boron oxide 26-2 in the crucible 24 are heated to a temperature above the melting point of indium phosphide to form an indium phosphide melt by means of the main heater 22 and the auxiliary heater 23.

The seed crystal rod 6 is lowered, so that the seed crystal 30 comes into contact with the indium phosphide melt to start crystal growth, and a single crystal ingot 31 is grown by pulling the seed crystal 30 through the seed crystal rod 6.

When 15-20% of the melt remains in the crucible, necking of the single crystal ingot 31 starts; when 0.5-3% of the melt remains in the crucible, the single crystal ingot 31 is lifted by the seed crystal rod 6, so that the necking interface rises to be near the optimal seeding position range.

The above process is referred to as a zero growth cycle.

II: one of the indium injection systems is heated to inject indium in the form of a melt into the crucible, and the heating is stopped until all of the indium is injected.

One phosphorus injection system is heated to inject phosphorus into the crucible in the form of a gas, and the heating is stopped until no more bubbles are emitted.

The indium and phosphorus injected by the heated indium injection system and phosphorus injection system are placed according to stoichiometric ratios, at which point a melt approximate to the chemical ratio is synthesized. The above process is referred to as a primary synthesis cycle.

III: the seed crystal rod 6 is adjusted so that the necking position of the single crystal ingot 31 comes into good contact with the melt, the temperature in the crucible 24 is controlled by the primary heater 22 and the auxiliary heater 23, and the growth of the single crystal ingot 31 is continued by starting seeding, diameter enlarging, and diameter equalizing, which start from the necking of the previous cycle.

When 15-20% of the melt remains in the crucible, necking of the single crystal ingot 31 starts; when 0.5-3% of the melt remains in the crucible, the single crystal ingot 31 is lifted by the seed crystal rod 6, so that the necking interface rises to be near the optimal seeding position range.

The above process is referred to as a primary growth cycle.

IV: the other indium injection system is heated to inject indium in the form of a melt into the crucible, and the heating is stopped until all of the indium is injected. The other phosphorus injection system is heated to inject phosphorus into the crucible in the form of a gas, and the heating is stopped until no more bubbles appear.

The indium and phosphorus injected by the heated indium injection system and phosphorus injection system described above are placed according to stoichiometric ratios, at which point a melt approximate to the chemical ratio is synthesized. The above process is referred to as a secondary synthesis cycle.

IV: the seed crystal rod 6 is adjusted so that the necking position of the single crystal ingot 31 comes into good contact with the melt, the temperature in the crucible 24 is controlled by the primary heater 22 and the auxiliary heater 23, and the growth of the single crystal ingot 31 is continued by starting seeding, diameter enlarging, and diameter equalizing, which start from the necking of the previous cycle.

When 15-20% of the melt remains in the crucible, necking of the single crystal ingot 31 starts; when 0.5-3% of the melt remains in the crucible, the single crystal ingot 31 is lifted by the seed crystal rod 6, so that the necking interface rises to be near the optimal seeding position range.

The above work is repeated for synthesis and growth of the single crystal ingot 31. The above process is referred to as a secondary growth cycle.

V: the lifting control of the furnace body in the above growth process is consistent with that in Example 1.

After completion of the crystal growth, the gas is vented, the primary furnace body 2 is raised until it is separated from the secondary furnace body 3, the single crystal ingot 31 is removed, and then water is injected into the crucible 24, so that the boron oxide is dissolve to relief the adhesion of the injection tube to the boron oxide. The synthesis system and the thermal field for single crystal growth are removed and the furnace body is cleaned.

The use of the raw materials can be determined by adding a weighing mechanism to the seed crystal rod 6 to weigh the grown crystal.

In the two examples above, the necking in step E is implemented prior to each raw material injection, i.e., it is done in the cases below: 1, the raw material placed in the crucible in advance is about to be exhausted (15-20% remained).

2, the raw material in the crucible is about to be exhausted (15-20% remained) after each injection.

In practical application, prior to synthesis and growth, the optimal seeding position range for the optimal yield and the minimum defect is experimentally determined, the position range of the liquid level of the melt in the crucible 24 is determined according to the optimal seeding position, and the total amount of the melt in the crucible below that position, i.e., the volume of the crucible below that position, is determined according to the intermediate value of the position range of the liquid level of the melt and the shape of the crucible 24.

The optimal seeding position range is the crucible position range within which the longitudinal temperature gradient near the surface of the melt in the crucible is the highest and the transverse temperature gradients are symmetrical. Here it refers to a range of height positions within the crucible.

The amount of the raw materials in one pair of raw material loading and injection systems is 1/n the total amount of the melt, n being a positive integer and n<5. The amounts of phosphorus and indium are obtained by calculating the amount after synthesis of indium phosphide.

In the above examples, the amount of indium and phosphorus in one pair of raw material loading and injection systems is 1/n the total amount of the melt.

According to the above settings, when n=1, necking is performed in cooperation with raw material injection each time; and when n>1, n pairs of raw material loading and injection systems are initiated consecutively for injection, i.e., step F: two or more raw material loading and injection systems are initiated to inject the raw materials into the crucible.

Synthesis and crystal growth are performed after completion of the injection, followed by necking.

When n pairs of raw material loading and injection systems are initiated consecutively, indium and phosphorus can be injected alternately, or all indium can be injected first, followed by injection of phosphorus.

By determining the amount of the raw materials in the raw material loading and injection systems according to the intermediate value of the position range of the liquid level of the melt, together with the unavoidable residual amount (0.5-3%) of indium phosphide in the crucible during the crystal growth process, it can ensure that seeding is in the optimal position after the completion of the synthesis of the raw materials in the crucible. In addition, the amount of indium and phosphorus in one pair of raw material loading and injection systems is 1/n the total amount of the melt, which can reduce the requirement of the capacity of the raw material loading and injection system and is easier to realize.

According to the above settings, in the finished single crystal, the weight of the crystal between neighboring necked parts is m times the total amount of phosphorus and indium in the pair of raw material loading and injection systems, m being a positive integer and m<5.

In general, if seeding is performed at the optimal position every time, m=n.

For an AxBy semiconductor, the molar ratio of A to B is x: 1.1-1.3y, where B is a volatile element.

Using the device provided by the present invention, the raw material injection system is changed for elementary substances, and elemental semiconductors such as monocrystalline silicon and germanium can be grown. By changing the system to a raw material loading and injection system for three raw materials, ternary or more compound semiconductor crystals such as zinc germanium phosphide (ZnGeP2) can also be grown.

When growing elemental crystals, the amount of the raw material in one raw material loading and injection system is 1/n the total amount of the melt; and when growing ternary compound semiconductor crystals, the amount of the raw materials in three raw material loading and injection systems is 1/n the total amount of the melt. Every time the raw materials are injected, one or three raw material loading and injection systems in a group are initiated as required.

What is claimed is:

1. A large-size single crystal growth system, comprising a crucible, two or more main body columns, a main furnace body disposed between the main body columns and located on a support table, wherein the system further comprises a crystal growth space control device and a raw material injection device within the furnace body, the raw material injection device comprising a plurality of raw material loading and injection systems independent to each other;

the crystal growth space control device comprises 1-4 movable furnace bodies disposed on an inner side or outer side of the main furnace body, the movable furnace bodies being disposed on the main body columns by means of drive motors and drive arms; and a top of the innermost or outermost movable furnace body is sealed, the other movable furnaces are open cylinders, and a seed crystal rod and a seed crystal rod driving device are disposed on the movable furnace with the top sealed;

the raw material injection device is disposed on a partition, and comprises an annular raw material water cooling disc and raw material loading and injection systems;

raw material slots are uniformly disposed on the raw material water cooling disc; the raw material loading and injection system includes a raw material loader, a resistance wire disposed around the raw material loader, a raw material injection tube in communication with the raw material loader, and a raw material loader top cover;

the raw material loading and injection system is inserted into the raw material slot, and the raw material injection tube protrudes from an injection tube groove;

6 to 12 raw material slots are provided; and 2 lengths are set for the raw material injection tube, the outlet of which is higher than or lower than the liquid level of the melt in the crystal growth process, respectively.

2. A method for preparing a large-size compound semiconductor single crystal, implemented by using the large-size single crystal growth system according to claim 1, wherein the method comprises the following steps:

step A, placing raw materials required for crystal growth in the crucible and the raw material loading and injection systems, so as to assemble the large-size single crystal growth system;

step B, heating the crucible to form a melt in the crucible;

step D, starting crystal growth;

step E, determining the residual amount of the raw material in the crucible, starting necking if the residual amount is less than 15-20% of the total amount of the raw material at the time of starting crystal growth, performing step F after the necking is completed, otherwise continuing the crystal growth;

step F, initiating two or more raw material loading and injection systems to inject the raw materials into the crucible; and step G, starting crystal growth while adjusting the crystal growth space using the crystal growth space control device according to the crystal length, and repeating steps E-G until the injection of all raw materials is completed.

3. The method for preparing the large-size compound semiconductor single crystal according to claim 2, wherein the position range of the liquid level of the melt in the crucible is determined according to the optimal seeding position range, a total amount of the melt below this position is determined according to an intermediate value in the position range of the liquid level of the melt and the shape of the crucible, and the amount of the raw materials in one pair of raw material loading and injection systems is 1/n the total amount of the melt, n being a positive integer and n<5.

4. The method for preparing the large-size compound semiconductor single crystal according to claim 2, wherein step A, metal indium is placed in the crucible, and phosphorus and metal indium are placed in the raw material loader of the raw material loading and injection system;

adding step C between step B and step D;

step C, initiating the raw material loading and injection system in which phosphorus is placed to inject gaseous phosphorus into the crucible.

5. The method for preparing the large-size compound semiconductor single crystal according to claim 4, wherein the amount of indium in the crucible is the same as the amount of indium in one raw material loading and injection system.

6. The method for preparing the large-size compound semiconductor single crystal according to claim 5, wherein in step A, indium phosphide is placed in the crucible, and phosphorus and metal indium are placed in the raw material loader of the raw material loading and injection system.

7. The method for preparing the large-size compound semiconductor single crystal according to claim 5, wherein in the raw material loading and injection system, the ratio of indium to phosphorus is 1:1.1-1.3.

8. The method for preparing the large-size compound semiconductor single crystal according to claim 7, wherein the weight of the crystal between neighboring necked parts is m times the total amount of phosphorus and indium in the pair of raw material loading and injection systems, m being a positive integer and m<5.

9. The method for preparing the large-size compound semiconductor single crystal according to claim 3, wherein the optimal seeding position range is the crucible position range within which the longitudinal temperature gradient near the surface of the melt in the crucible is the highest and the transverse temperature gradients are symmetrical.

\* \* \* \* \*